(12) United States Patent
Bourdelle et al.

(10) Patent No.: US 8,309,426 B2
(45) Date of Patent: Nov. 13, 2012

(54) METHODS FOR MANUFACTURING MULTILAYER WAFERS WITH TRENCH STRUCTURES

(75) Inventors: Konstantin Bourdelle, Crolles (FR); Carlos Mazure, Bernin (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/093,615

(22) Filed: Apr. 25, 2011

(65) Prior Publication Data

US 2011/0294277 A1    Dec. 1, 2011

(30) Foreign Application Priority Data

May 25, 2010   (EP) .................................... 10290274

(51) Int. Cl.
*H01L 21/76* (2006.01)
(52) U.S. Cl. ....................................................... 438/424
(58) Field of Classification Search .................... 438/424
See application file for complete search history.

(56) References Cited

U.S. PATENT DOCUMENTS

| | | | | |
|---|---|---|---|---|
| 5,581,110 A | 12/1996 | Razouk et al. | ................. | 257/513 |
| 5,911,109 A | 6/1999 | Razouk et al. | ................. | 438/424 |
| 6,486,038 B1 | 11/2002 | Maszara et al. | ............... | 438/424 |
| 6,524,929 B1 | 2/2003 | Xiang et al. | ................... | 438/424 |
| 6,602,759 B2 | 8/2003 | Ajmera et al. | ................. | 438/431 |
| 6,734,082 B2 | 5/2004 | Zheng et al. | ................... | 438/435 |
| 7,176,549 B2 | 2/2007 | Schuegraf et al. | ............ | 257/506 |
| 7,501,691 B2 * | 3/2009 | Smythe et al. | ................. | 257/510 |
| 7,915,155 B2 | 3/2011 | Moens et al. | .................. | 438/561 |
| 2002/0195637 A1 | 12/2002 | Kokubun | ....................... | 257/301 |
| 2004/0209479 A1 * | 10/2004 | Heo et al. | ....................... | 438/720 |
| 2008/0157260 A1 | 7/2008 | Fried et al. | ..................... | 257/506 |
| 2009/0184356 A1 | 7/2009 | Brodsky et al. | ............... | 257/301 |

FOREIGN PATENT DOCUMENTS

| | | |
|---|---|---|
| DE | 10 2006 029701 A1 | 1/2008 |
| EP | 0 645 808 A1 | 3/1995 |
| EP | 2 390 907 A1 | 11/2011 |

OTHER PUBLICATIONS

European Search Report Application No. EP 10290274 dated Oct. 25, 2010.
European Search Report Application No. EP 11 00 3289 dated Sep. 1, 2011.

* cited by examiner

*Primary Examiner* — Charles Garber
*Assistant Examiner* — Andre' C Stevenson
(74) *Attorney, Agent, or Firm* — Winston & Strawn LLP

(57) ABSTRACT

The present invention provides methods for the manufacture of a trench structure in a multilayer wafer that comprises a substrate, an oxide layer on the substrate and a semiconductor layer on the oxide layer. These methods include the steps of forming a trench through the semiconductor layer and the oxide layer and extending into the substrate, and of performing an anneal treatment of the formed trench such that at the inner surface of the trench some material of the semiconductor layer flows at least over a portion of the part of the oxide layer exposed at the inner surface of the trench. Substrates manufactured according to this invention are advantageous for fabricating various semiconductor devices, e.g., MOSFETs, trench capacitors, and the like.

17 Claims, 3 Drawing Sheets

METHODS FOR MANUFACTURING MULTILAYER WAFERS WITH TRENCH STRUCTURES

FIELD OF THE INVENTION

The present invention relates to multilayer wafers, in particular, to ultra thin buried oxide (UTBOX) wafers designed for the fabrication of CMOS devices, and to the manufacture of improved shallow trench isolation (STI) structures in such wafers.

BACKGROUND OF THE INVENTION

Because wafers with silicon on thin buried oxide layers (BOX) or on ultra thin buried oxide (UTBOX) layers are advantageously characterized by small variations of threshold-voltages, they are of growing interest in present and future CMOS technology. In particular, fully depleted CMOS technology allows for low-voltage and low-power circuits operating at high speeds. Moreover, fully depleted silicon-on-insulator (SOI) devices are considered as some of the most promising candidates for reducing short channel effects (SCE).

Silicon on Insulator (SOI) wafers and, in particular, UTBOX wafers, can form the basis for high-performance MOSFET and CMOS technologies. The control of SCE is mainly facilitated by the thinness of the active silicon layer formed above the insulator, i.e. above the buried oxide (BOX) layer. In order to reduce the coupling effect between source and drain and, further, to improve the scalability of thin film devices for future technologies, very thin BOX layers are mandatory. Control of threshold voltages also depends of the thinness of the BOX layers. Appropriate implantation of the substrate below the BOX layer allows for accurate adjustment of the threshold voltage by back biasing.

In the manufacture of SOI devices, in particular, of CMOS devices, trenches usually have to be formed, for example, in order to electrically isolate individual MOSFETs from each other. The formed trenches can be cleaned, slightly oxidized, and subsequently filled with an oxide liner and some insulator material above the liner, so as to form shallow trench isolation (STI) structures. However, in the manufacture of such trench structures, for example, STIs, a problem known as the so-called Bird's Beak Effect can arise. The Bird's Beak Effect in the context of the formation of trenches in SOI wafers is characterized by the increase in the thickness of the BOX layer in the areas close to the edges of a trench.

One of the reasons behind the Bird's Beak Effect is related to under-etching of the BOX layer, as can, for example, occur during a cleaning process that usually comprises hydrofluoric dipping. Another reason behind the Bird's Beak Effect is lateral oxidation of a not completely closed bonding interface within the BOX layer. Such bonding layers with interfaces can arise when the SOI wafer is manufactured by oxide-oxide bonding wherein, for example, a thin silicon layer is covered by an oxide layer, for example, an $SiO_2$ layer, and transferred to a substrate that is also covered by an oxide layer of the same type.

Thus, there is a need for improved methods for the formation of trenches and corresponding isolator structures that alleviates the Bird's Beak Effect.

SUMMARY OF THE INVENTION

Accordingly, the present invention provides methods for the manufacture of trench structures in multilayer wafers comprising a substrate, an oxide layer on the substrate and a semiconductor layer on the oxide layer. In one embodiment, the method comprises:

forming a trench through the semiconductor layer and the oxide layer (BOX layer) and extending into the substrate; and performing an anneal treatment of the formed trench under conditions selected such that at the inner surface of the trench some material of the semiconductor layer flows over at least a portion of the oxide layer exposed at the inner surface of the trench.

In particular, the substrate can be a silicon substrate; the oxide layer can be a silicon (di)oxide layer ($SiO_2$); and the semiconductor layer can be a silicon layer, for example, a single crystal silicon layer.

Although the following description of the invention is largely in terms of substrates having such compositions, this invention is not limited to such substrates, and in other embodiments, is applicable more generally to semiconductor-on-insulator (SeOI) substrates. In view of the following description, one of ordinary skill in the art will be able to select parameters (e.g., thermal anneal atmospheres, temperatures and durations) appropriate to different semiconductors.

The thermal annealing step effectively reduces Bird's Beak effects that might arise during subsequent manufacturing steps using the formed trench. The semiconductor material overflowing the oxide exposed in the trench prevents under-etching of the semiconductor layer in subsequent cleaning processes, and also prevents unintended lateral oxidation of the previously exposed oxide layer when forming an oxide liner, for example, on the inner surfaces of the trench.

According to another embodiment, a cleaning treatment of the trench is performed after the thermal annealing. The cleaning treatment may comprise cleaning with a hydrofluoric acid solution, in particular, dipping in a hydrofluoric acid solution. No under-etching of the semiconductor layer is caused by the hydrofluoric acid solution due to the protective coating of the material of the semiconductor layer that has flowed over the exposed oxide surface during the thermal annealing.

After the thermal anneal and cleaning treatment, an oxide liner may be formed in the trench. The oxide liner may be formed by thermal oxidation of the wafer including the trench. The thickness of the formed oxide should be sufficient to consume the material that has flowed over the exposed oxide surface during the thermal annealing semiconductor material and, by so doing, to prevent an electrical short/connection between top Si layer and silicon substrate below the BOX layer. The method may, further, comprise filling the trench with an insulator material after the anneal treatment and after formation of the oxide liner.

The anneal treatment can be preferably performed, for example, at a temperature of at least 1100° C., in particular, at least 1150° C. and, more particularly, at least 1200° C. Moreover, the anneal treatment can be preferably performed in a hydrogen and/or argon atmosphere. The thermal anneal treatment can be preferably performed for a rather short time period, for example, for at most 4 minutes, in particular, at most 3 minutes and, more particularly, at most 2 minutes.

In the above-described embodiments of the invention, the BOX layer preferably can have a thickness in the range from 5 to 20 nm and the top semiconductor layer in an UTBOX wafer preferably can have a thickness in the range from 10 to 50 nm. Thus, a trench can be formed in a UTBOX wafer comprising a very thin BOX layer and a thin silicon layer intended to serve as an active layer for a semiconductor device, for example, an SOI CMOS device. The methods of the invention (and particularly the step of thermal annealing) can effectively suppress the Bird's Beak effect for thin BOX layers, even for BOX layers as thin as 2 to 20 nm. It is in such very thin BOX layers where the Bird's Beak effect is particularly problematic.

In further embodiments, the multilayer wafers in which trenches are formed by the methods of this invention can be manufactured by method comprising the steps of:
   forming a first oxide layer above the substrate;
   forming a second oxide layer above a second substrate;
   bonding the first and the second oxide layers, and
   removing the second substrate as part of a wafer transfer process
      so as to form a multilayer structure with a thin BOX layer sandwiched between the substrate and the thin, surface semiconductor layer that remains after the second substrate is removed.

It is noted that in the case that the multilayer is manufactured as above, the thermal anneal step of the present invention advantageously also results in a consolidation of the bonding interfaces of the first and second oxide layers (that, when bonded together, form the BOX layer of the wafer). This consolidation is to be understood in the sense of a complete closing of the interface between the two oxide layers thereby resulting in an homogeneous BOX layer with few if any traces of the bonding interface. Due to the thus achieved homogeneity of the BOX layer, the Bird's Beak Effect caused by lateral oxidation (e.g., when forming by thermal oxidation an oxide liner at the inner surfaces of the trench) can be further significantly suppressed.

In further embodiments, the present invention also provides methods for the manufacture of semiconductor devices in a multilayer wafer, comprising the steps of
   manufacturing a trench (structure) in the multilayer wafer according to the invention; and
   forming a plurality of MOSFET devices over and partially in the multilayer wafer,
      wherein at least two of the MOSFET devices are separated from each other by the trench (structure).

In particular, in this method, the substrate may be doped to serve as a back-gate substrate and the other device may comprise a back-gate terminal intended for back-gate biasing. (Back gates are described in, e.g., U.S. application Ser. No. 12/961,293, filed Dec. 6, 2010, and titled "Arrays Of Transistors With Back Control Gates Buried Beneath The Insulating Film Of A Semiconductor-On-Insulator Substrate," which is assigned to the assignee of the present application and which is incorporated herein by reference.)

In further embodiments, the present invention also provides methods for the manufacture of a trench capacitor in a multilayer wafer, comprising the steps of
   manufacturing a trench structure in the multilayer wafer according to the invention;
   forming a node dielectric on the inside surfaces of the trench (after the anneal treatment during trench formation); and
   filling a conductive material in the trench after the formation of the node dielectric.

One electrode is formed by the conductive material filled into the trench and the other may be formed by the (e.g., doped polysilicon) substrate.

Additional features and advantages of the present invention will be described with reference to the drawings, which are meant to illustrate preferred embodiments of the invention. It is understood that such embodiments do not represent the full scope of the invention. Further aspects and details, and alternate combinations of the elements, of this invention that will be apparent from the following detailed description to one of ordinary skill in the art are also understood to be within the scope of this invention.

BRIEF DESCRIPTION OF THE DRAWINGS

The present invention may be understood more fully by reference to the following detailed description of the preferred embodiments of the present invention, illustrative examples of specific embodiments of the invention and the appended figures in which.

DETAIL DESCRIPTION OF THE PREFERRED EMBODIMENTS

In the following, preferred embodiments of the methods of the invention for forming trench structures in multilayer wafers is described.

Figure 1A:
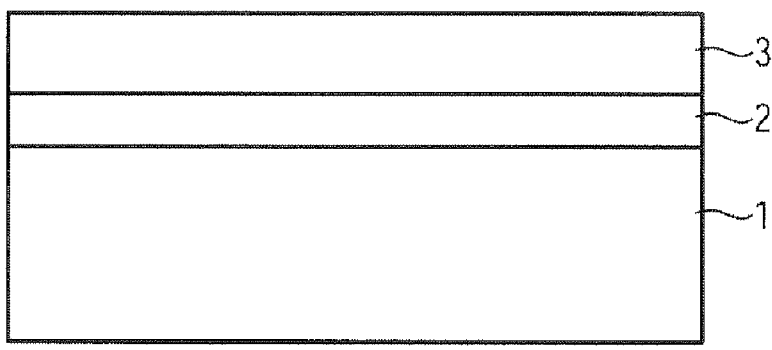
FIGS. 1*a* to 1*f* illustrate an embodiment of the methods for the manufacture of an STI in an SOI wafer according to the present invention.

First, a wafer as shown in FIG. 1*a* is provided. The provided multilayer wafer comprises a substrate 1, a first layer 2 and a second layer 3. According to the present preferred embodiment, the multilayer wafer is an SOI wafer, i.e. the substrate 1 is a silicon substrate, the first layer 2 is an oxide layer (a BOX layer) and the second layer 3 is a silicon surface layer. In an alternative embodiment, the multilayer wafer is a SeOI wafer. The multilayer wafer shown in FIG. 1*a* may be obtained by one of the wafer transfer techniques known in the art. For example, a silicon surface layer may be grown on a donor substrate and, subsequently, a silicon (di)oxide layer is formed on the grown silicon surface layer. Also, a silicon (di)oxide layer is formed on the substrate 1. During the wafer transfer process the oxide layer formed on the silicon surface layer and the oxide layer formed on the substrate 1 are bonded to each other, and the donor substrate is removed leaving the wafer comprising the substrate 1, the oxide layer 2 and the silicon layer 3, which was the silicon surface layer of the donor substrate.

Figure 1B:
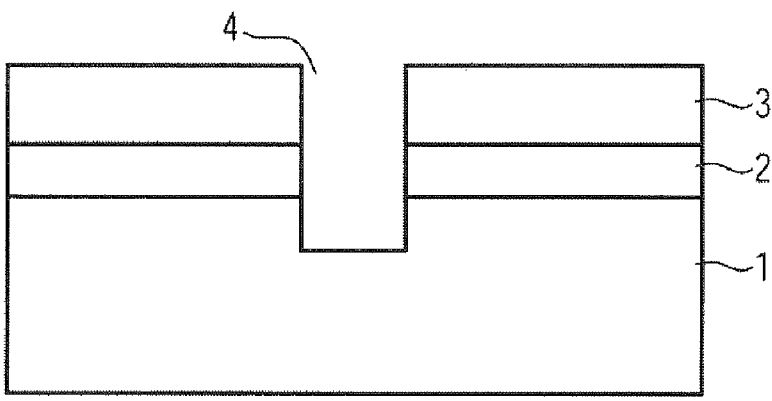

Next, a trench 4 is formed in the wafer shown in FIG. 1*a* that extends through the silicon layer 3 and the oxide layer 2 and into the substrate 1. The resulting wafer is shown in FIG. 1*b*. Formation of the trench may be facilitated by forming a mask layer, for example, a nitride mask layer, atop the silicon layer 3 and a photoresist atop the mask layer (not shown). After patterning the trench 4 can be etched and both the mask layer and the photoresist are removed.

Figure 1C:
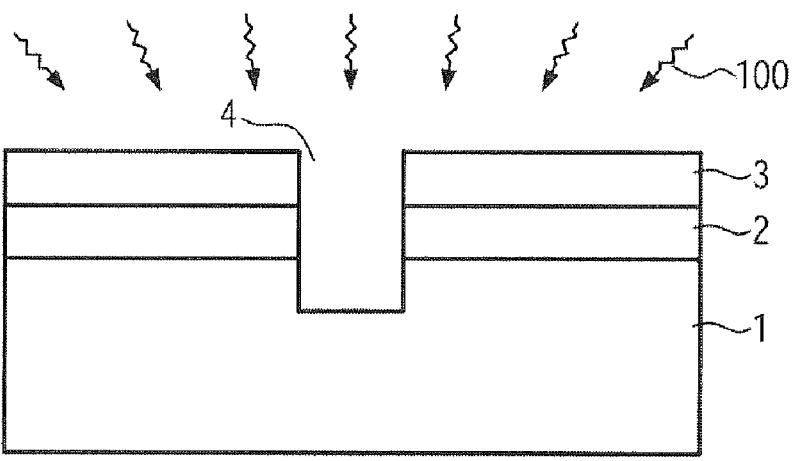

After the formation of the trench 4 in the multilayer wafer, a rapid thermal anneal process 100 is performed (see FIG. 1*c*). For this process, the wafer (the trench) is exposed in an anneal atmosphere preferably including, for example, hydrogen and/or argon at a temperature of preferably at least 1100° C., or, e.g., 1150° C., or, e.g., 1200° C. or 1250° C. or more, and for preferably at most 4 minutes, for example, at most 2 or 3 minutes. The conditions of the rapid thermal anneal process 100 are selected so that this anneal results in some flow of the silicon of the silicon layer 3 (not shown) at the inside surface of the trench 4 such that the flowing silicon at least partially covers the part of the oxide layer 2 that is exposed at the inner surface of the trench 4. Thereby, the Bird's Beak Effect is suppressed during the subsequent manufacturing procedure.

Figure 1D:
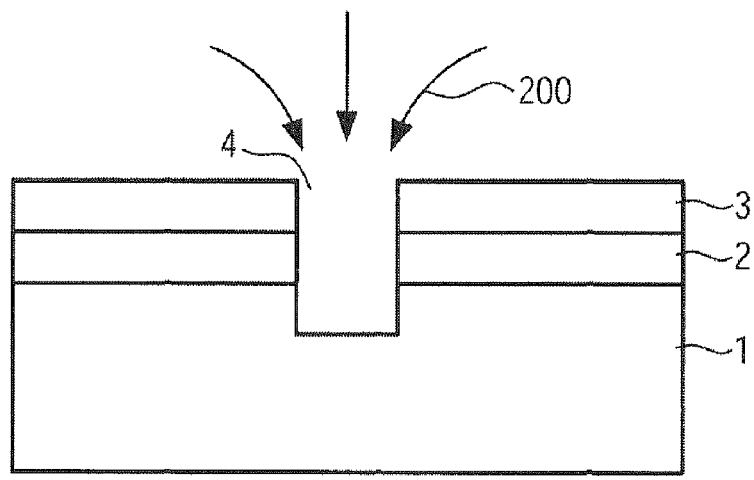
Figure 1E:
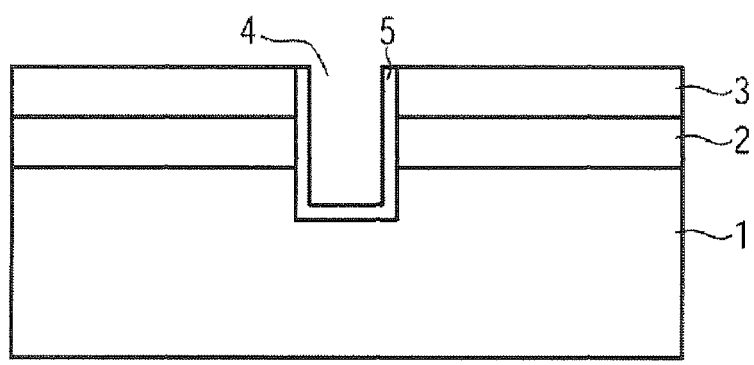
Figure 1F:
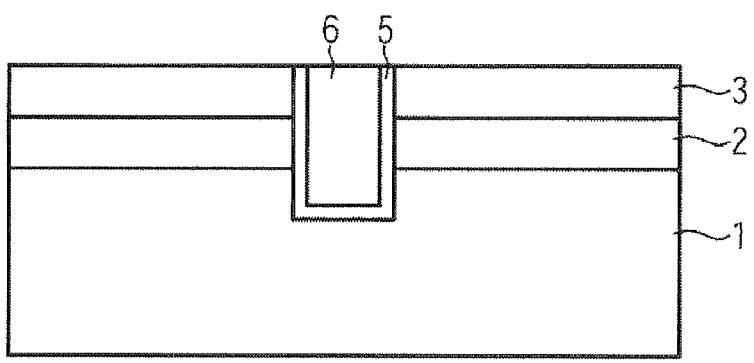

Next, the trench 4 is cleaned 200 preferably by, e.g., a hydrofluoric acid solution as shown in FIG. 1*d*. For example, a 10% to 20% hydrofluoric acid solution may be used for dip cleaning of the wafer and the trench 4. Under-etching of the silicon layer 3 is effectively prevented by the previously performed anneal treatment 100. After the cleaning process 200, an oxide liner 5 can be formed on the inner surfaces of the trench 4 (see FIG. 1*e*). The oxide liner 5 can preferably be formed by thermal oxidation, for example, in an oxygen atmosphere, in particular, comprising $O_2/H_2$ or $O_2/H_2$/HCl or $O_2$/HCl at a temperature of 800° C. to 1000° C.

Again, the Bird's Beak Effect that might otherwise be caused by lateral oxidation of an imperfectly closed oxide-oxide interface within the oxide layer 2 (such as might result from the above-described manufacturing process comprising wafer transfer) is suppressed by the previously performed anneal treatment 100.

Next, the trench is filled with some insulator material 6, for example, some nitride or oxide material, to finish the formation of an STI (see FIG. 10. By appropriately arranging such STI trenches, different individual transistors, e.g., different MOSFETs, can be separated and preferably isolated from each other. The separated MOSFETs may be of different conductivity types and may be part of a single CMOS device.

The above-described embodiment for forming the trench structure shown in FIGS. 1*c* and 1*d* may be applied to the formation of trench capacitors, which, for example, form memory cells, e.g., a DRAM cell on SOI comprising such a trench capacitor. For this purpose, on the inner surfaces of the trench 4 shown in FIGS. 1*c* or 1*d* a node dielectric, for example, of silicon nitride or silicon oxide, is formed and, subsequently, the trench 4 is filled with a electrically conductive material, for example, a metal like copper, nickel, etc, or n+ doped polysilicon. Such a trench capacitor can be connected to an access transistor that is also formed on and partially in the multilayer wafer.

Figure 2:
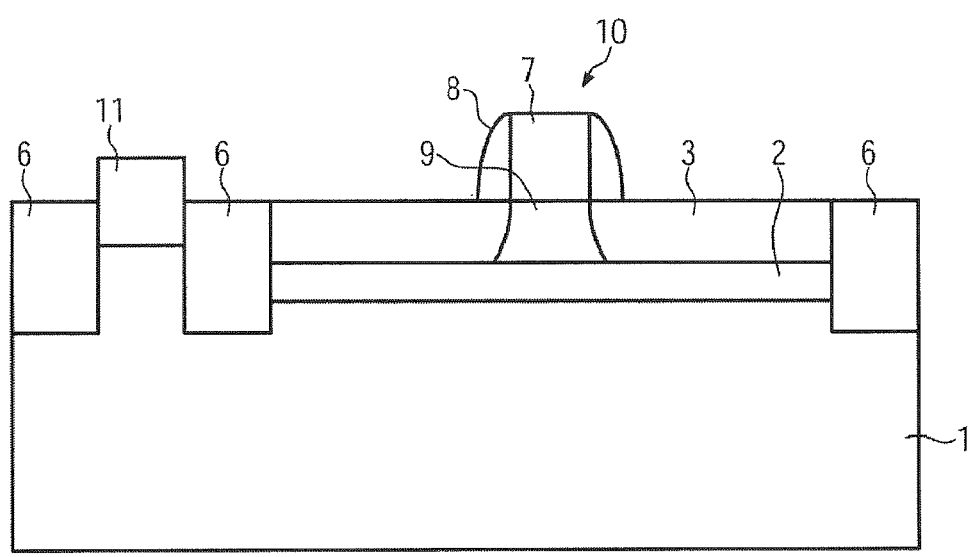
FIG. 2 illustrates exemplary devices on an ultra thin BOX wafer manufactured according to the present invention.

The above-described embodiment for forming trench structures, in particular, STIs, may also be applied as illustrated in FIG. 2. This figure illustrates a silicon on UTBOX device that comprises a MOSFET 10 with a gate electrode 7 and sidewall spacers 8. In the active silicon layer 3 a channel region 9 is formed below the gate electrode 7. Source/drain regions are formed adjacent to the channel region in the silicon layer 3. Below the silicon layer 3 a very thin BOX layer 2 is located that is formed on a polysilicon substrate 1. The substrate 1 below the active region of the MOSFET 10 is appropriately doped to function as a back-gate substrate. Moreover, the shown device comprises a back-gate terminal 11 located between STIs 6 on the left-hand side. Another STI 6 limits the shown active region on the right-hand side. It is noted that silicide regions may be formed adjacent to the sidewall spacers 8 and that it might be preferred that the gate electrode is at least partially silicided.

In the example shown in FIG. 2 is it particularly advantageous to provide STIs manufactured according to the present invention (i.e., formed by process steps including the thermal anneal as it is described with reference to FIG. 1*c*), because the present invention avoids the Bird's Beak Effect that otherwise would result in a significant deterioration of the performance of the finished silicon on UTBOX (CMOS) device.

The preferred embodiments of the invention described above do not limit the scope of the invention, since these embodiments are illustrations of several preferred aspects of the invention. Any equivalent embodiments are intended to be within the scope of this invention. Indeed, various modifications of the invention in addition to those shown and described herein, such as alternate useful combinations of the elements described, will become apparent to those skilled in the art from the subsequent description. Such modifications are also intended to fall within the scope of the appended claims.

What is claimed is:

1. A method for manufacturing a trench structure in a multilayer wafer, the multilayer wafer comprising a substrate, an oxide layer on the substrate and a surface semiconductor layer on the oxide layer, which comprises:
   forming a trench in the multilayer wafer that extends through the semiconductor layer and the oxide layer and into the substrate; and
   performing an anneal treatment of the formed trench under conditions selected such that at the inner surface of the trench some material of the semiconductor layer flows over at least a portion of the oxide layer exposed at the inner surface of the trench.

2. The method according to claim 1, further comprising performing a cleaning treatment of the trench after the anneal treatment.

3. The method according to claim 2, wherein the cleaning treatment comprises cleaning with a hydrofluoric acid solution, wherein the semiconductor material overflowing the oxide exposed in the trench is sufficient to prevent under-etching of the semiconductor layer by the acid.

4. The method according to claim 1, wherein the anneal treatment is performed at a temperature of at least 1100° C.

5. The method according to claim 1, wherein the anneal treatment is performed at a temperature of at least 1200° C.

6. The method according to claim 1, wherein the anneal treatment is performed in an atmosphere comprising one or both of hydrogen and argon.

7. The method according to claim 1, wherein the anneal treatment is performed for at most 4 minutes.

8. The method according to claim 7, wherein the anneal treatment is performed for at most 2 minutes.

9. The method according to claim 1, wherein the substrate and the semiconductor layer comprise silicon, and the oxide layer comprises $SiO_2$ and the thermal annealing step effectively reduces "Bird's Beak Effects" that could arise during subsequent manufacturing steps using the formed trench.

10. The method according to claim 9, wherein the substrate and the semiconductor layer consist essentially of silicon, and the oxide layer comprises $SiO_2$.

11. The method according to claim 1, wherein the oxide layer has a thickness in the range from about 5 to about 20 nm, and the semiconductor layer has a thickness in the range from about 10 to about 50 nm.

12. The method according to claim 1, wherein the multilayer wafer is fabricated by a process comprising:
   forming a first oxide surface layer on the substrate;
   forming a second oxide surface layer on a second substrate;
   bonding the first and the second oxide layers; and
   removing the second substrate so as to leave a structure comprising the substrate, the oxide layer, and a surface semiconductor layer on the oxide layer.

13. The method according to claim 1, further comprising forming by thermal oxidation an oxide layer lining the trench after the anneal treatment, wherein the semiconductor material overflowing the oxide exposed in the trench is sufficient to prevent unintended lateral oxidation of the previously exposed oxide layer when forming the oxide liner on inner surfaces of the trench.

14. The method according to claim 1, further comprising filling the trench with an insulator material after the anneal treatment.

15. A method for manufacturing semiconductor devices comprising:
  manufacturing a trench structure in a multilayer wafer according to the method of claim 1; and
  forming a plurality of MOSFET devices over and partially in the multilayer wafer,
  wherein at least two of the MOSFET devices are separated from each other by the trench structure.

16. The method according to claim 15, wherein the substrate is doped to serve as a back-gate substrate, and wherein at least one MOSFET device comprises a back-gate terminal.

17. A method for manufacturing a trench capacitor comprising:
  manufacturing a trench structure in a multilayer wafer according to the method of claim 1;
  forming a node dielectric on the inside surfaces of the trench after the anneal treatment; and
  filling a conductive material in the trench after the formation of the node dielectric.

* * * * *